United States Patent
Fukuda et al.

(10) Patent No.: US 10,403,497 B2
(45) Date of Patent: Sep. 3, 2019

(54) METHOD OF MANUFACTURING SILICON CARBIDE SEMICONDUCTOR DEVICE AND SILICON CARBIDE SEMICONDUCTOR DEVICE

(71) Applicant: SHINDENGEN ELECTRIC MANUFACTURING CO., LTD., Chiyoda-ku, Tokyo (JP)

(72) Inventors: Yusuke Fukuda, Saitama (JP); Yoshiyuki Watanabe, Saitama (JP); Shunichi Nakamura, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/314,471

(22) PCT Filed: Aug. 12, 2015

(86) PCT No.: PCT/JP2015/072883
§ 371 (c)(1),
(2) Date: Nov. 28, 2016

(87) PCT Pub. No.: WO2017/026068
PCT Pub. Date: Feb. 16, 2017

(65) Prior Publication Data
US 2018/0174835 A1 Jun. 21, 2018

(51) Int. Cl.
*H01L 21/02* (2006.01)
*H01L 21/268* (2006.01)
(Continued)

(52) U.S. Cl.
CPC .. *H01L 21/02529* (2013.01); *H01L 21/02183* (2013.01); *H01L 21/02186* (2013.01);
(Continued)

(58) Field of Classification Search
CPC ........... H01L 29/6606; H01L 26/02186; H01L 21/268
See application file for complete search history.

(56) References Cited

U.S. PATENT DOCUMENTS

| | | | |
|---|---|---|---|
| 2005/0104072 A1 | 5/2005 | Slater, Jr. et al. | |
| 2011/0092063 A1 | 4/2011 | Kawai et al. | |

(Continued)

FOREIGN PATENT DOCUMENTS

| | | | | |
|---|---|---|---|---|
| JP | 2003243323 A | * | 8/2003 | ......... H01L 21/0485 |
| JP | 2008135611 A | * | 6/2008 | ......... H01L 21/0485 |

(Continued)

OTHER PUBLICATIONS

International Search Report in International Application No. PCT/JP2015/072883, dated Sep. 29, 2015.
(Continued)

*Primary Examiner* — Charles D Garber
*Assistant Examiner* — Alia Sabur
(74) *Attorney, Agent, or Firm* — Hauptman Ham, LLP

(57) ABSTRACT

A method of manufacturing a silicon carbide semiconductor device includes, in order: polishing a silicon carbide semiconductor base body from a second main surface side thus forming unevenness on a second main surface; forming a thin metal film made of metal capable of forming a metal carbide on the second main surface of the silicon carbide semiconductor base body; irradiating a laser beam which falls within a visible region or within an infrared region to the thin metal film so as to heat the thin metal film thus forming a metal carbide on a boundary face between the silicon carbide semiconductor base body and the thin metal film; etching a metal containing byproduct layer possibly formed on a surface side of the metal carbide by a non-oxidizing chemical solution thus exposing a surface of the
(Continued)

metal carbide; and forming a cathode electrode on the metal carbide.

9 Claims, 11 Drawing Sheets

(51) Int. Cl.
*H01L 29/45* (2006.01)
*H01L 29/34* (2006.01)
*H01L 29/16* (2006.01)
*H01L 21/28* (2006.01)
*H01L 21/302* (2006.01)
*H01L 29/872* (2006.01)
*H01L 29/66* (2006.01)
*H01L 29/06* (2006.01)
*H01L 29/861* (2006.01)
*H01L 29/868* (2006.01)
*H01L 21/04* (2006.01)
*H01L 29/78* (2006.01)

(52) U.S. Cl.
CPC .......... *H01L 21/0485* (2013.01); *H01L 21/28* (2013.01); *H01L 21/302* (2013.01); *H01L 29/0657* (2013.01); *H01L 29/1608* (2013.01); *H01L 29/34* (2013.01); *H01L 29/45* (2013.01); *H01L 29/6606* (2013.01); *H01L 29/66068* (2013.01); *H01L 29/66712* (2013.01); *H01L 29/868* (2013.01); *H01L 29/8611* (2013.01); *H01L 29/872* (2013.01); *H01L 21/268* (2013.01); *H01L 29/0615* (2013.01); *H01L 29/7802* (2013.01)

(56) References Cited

U.S. PATENT DOCUMENTS

| | | | |
|---|---|---|---|
| 2011/0256675 A1 | 10/2011 | Avouris et al. | |
| 2011/0306188 A1* | 12/2011 | Kawai | H01L 21/268 438/482 |
| 2013/0102127 A1* | 4/2013 | Kawai | H01L 21/0485 438/463 |
| 2013/0140713 A1* | 6/2013 | Yu | H01L 23/544 257/782 |
| 2014/0061674 A1 | 3/2014 | Imai | |

FOREIGN PATENT DOCUMENTS

| | | | | |
|---|---|---|---|---|
| JP | 2010205824 A | * | 9/2010 | ......... H01L 21/0485 |
| JP | 2011-91100 A | | 5/2011 | |
| JP | 2011-96905 A | | 5/2011 | |
| JP | 5460975 B2 | | 4/2014 | |
| TW | I402997 B | | 7/2013 | |

OTHER PUBLICATIONS

Extended European Search Report in EP Application No. 15889428.7, dated Mar. 1, 2019, 8pp.

* cited by examiner irradiation of laser beam in visible region or infrared region

METHOD OF MANUFACTURING SILICON CARBIDE SEMICONDUCTOR DEVICE AND SILICON CARBIDE SEMICONDUCTOR DEVICE

RELATED APPLICATIONS

The present application is a National Phase entry of International Application No. PCT/JP2015/072883, filed Aug. 12, 2015.

TECHNICAL FIELD

The present invention relates to a method of manufacturing a silicon carbide semiconductor device and a silicon carbide semiconductor device.

BACKGROUND ART

Conventionally, in a process of forming a vertical power device on a silicon carbide semiconductor base body, informing an electrode for connecting a power device with an external electric circuit or the like such as a drain electrode, for example, there has been a demand for the formation of an ohmic electrode on the silicon carbide semiconductor base body for reducing a contact resistance between the silicon carbide semiconductor base body and the drain electrode or the like.

As a first method of forming an ohmic electrode, there has been known a method where an Ni silicide layer is formed on a silicon carbide semiconductor base body by a silicide process where an Ni thin film is formed on a silicon carbide semiconductor base body and, thereafter, heat treatment is performed. However, in the above-mentioned first method, to form the Ni silicide layer by generating a reaction between Ni derived from an Ni thin film and Si derived from a silicon carbide semiconductor base body, heat treatment at a temperature of 1000° C. or above is necessary. Accordingly, when an element is formed on the silicon carbide semiconductor base body in advance, there exists a drawback that the element is broken.

In view of the above, as a method of forming an ohmic electrode, a second method which can overcome the above-mentioned drawback has been known (see patent literature 1, for example). The second method is performed as follows. An element (MOS structure) not shown in the drawing is formed on a first main surface 912 of a silicon carbide semiconductor base body 910 (see FIG. 10A and FIG. 10B). Then, a protective film 916 is formed on the first main surface 912 of the silicon carbide semiconductor base body 910 and, thereafter, unevenness is formed on a second main surface 914 of the silicon carbide semiconductor base body 910 by polishing the second main surface 914 (see FIG. 10C). Then, a thin metal film 918 made of metal capable of forming silicide (for example, an Ni thin film) is formed on the second main surface 914 (see FIG. 10D). Next, a metal silicide layer 920 is formed between the silicon carbide semiconductor base body 910 and the thin metal film 918 by irradiating a laser beam which falls within an ultraviolet region onto the thin metal film 918 thus forming an ohmic electrode 924 (see FIG. 11A). In patent literature 1, after the ohmic electrode 924 is formed, a drain electrode 926 is formed on the ohmic electrode 924 (see FIG. 11B), and a source electrode 928 and a gate electrode not shown in the drawing are formed on a first main surface 912 side of the silicon carbide semiconductor base body 910 (see FIG. 11C) thus manufacturing a power MOSFET.

According to the second method, the metal silicide layer is formed by irradiating a laser beam which falls within an ultraviolet region and hence, unlike the above-mentioned first method, heat treatment at a high temperature becomes unnecessary. Accordingly, even when an element is formed on a silicon carbide semiconductor base body in advance, there is no possibility that the element is broken whereby an ohmic electrode can be formed after the element is formed on the silicon carbide semiconductor base body.

CITATION LIST

Patent Literature

Patent Literature 1: Japanese Patent No. 5460975

SUMMARY OF INVENTION

Technical Problem

However, in the above-mentioned second method, there exists a drawback that when a laser beam which falls within an ultraviolet region is directly irradiated to the silicon carbide semiconductor base body, carbon precipitates so that an electrode peeling phenomenon (particularly a peeling phenomenon between the ohmic electrode 924 and back metal (the drain electrode 926 in this case) occurs. Further, since an attenuation coefficient of the thin metal film is low in an ultraviolet region, a silicide reaction becomes insufficient thus giving rise to a drawback that a resistance characteristic and an adhesion characteristic of an ohmic electrode are deteriorated (that is, a resistance value is increased and the adhesiveness is decreased). There also exists a drawback that a device for irradiating a laser beam which falls within an ultraviolet region is extremely expensive thus pushing up a manufacturing cost.

The present invention has been made to overcome the above-mentioned drawback, and it is an object of the present invention to provide a method of manufacturing a silicon carbide semiconductor device and a silicon carbide semiconductor device where an ohmic electrode having an excellent resistance characteristic and an excellent adhesive characteristic can be manufactured at a low manufacturing cost without giving rise to a problem on carbon precipitation.

Solution to Problem

[1] A method of manufacturing a silicon carbide semiconductor device of the present invention includes, in the following order: a silicon carbide semiconductor base body preparation step of preparing a silicon carbide semiconductor base body having a first main surface which is an element forming surface and a second main surface which is a surface on a side opposite to the first main surface; a polishing step of polishing the silicon carbide semiconductor base body from a second main surface side thus forming unevenness on the second main surface; a thin metal film forming step of forming a thin metal film made of metal capable of forming a metal carbide on the second main surface of the silicon carbide semiconductor base body; a laser beam irradiating step of irradiating a laser beam which falls within a visible region or within an infrared region to the thin metal film so as to heat the thin metal film thus forming a metal carbide on a boundary face between the silicon carbide semiconductor base body and the thin metal film; an etching step of removing by etching a metal containing byproduct layer possibly formed on a surface side of the metal carbide by a non-oxidizing chemical solution thus exposing a surface of the metal carbide; and an electrode layer forming step of forming an electrode layer on the metal carbide.

[2] In the method of manufacturing a silicon carbide semiconductor device of the present invention, it is preferable that metal capable of forming the metal carbide be one, two or more metals selected from a group consisting of Ti, Ta, W, Mo, an alloy of Ti, an alloy of Ta, an alloy of W, and an alloy of Mo.

[3] In the method of manufacturing a silicon carbide semiconductor device of the present invention, it is preferable that metal capable of forming the metal carbide be Ti or an alloy of Ti.

[4] In the method of manufacturing a silicon carbide semiconductor device of the present invention, it is preferable that the laser beam which falls within a visible region or within an infrared region be a green laser beam (wavelength: 532 nm).

[5] In the method of manufacturing a silicon carbide semiconductor device of the present invention, it is preferable that the laser beam irradiating step be performed under a condition that the metal carbide is formable on a boundary face between the silicon carbide semiconductor base body and the thin metal film, and a temperature of a first main surface side of the silicon carbide semiconductor base body at the time of forming the metal carbide by a laser beam which passes through the thin metal film remains at or below a maximum process temperature at the time of forming an element.

The above-mentioned condition includes conditions relating to power of a laser beam, a wavelength of the laser beam, a spot diameter of the laser beam, a throttle angle of the laser beam, a scanning speed of the laser beam, a method of irradiating the laser beam (continuous irradiation or intermittent irradiation), a thickness of a thin metal film, a thickness of a semiconductor base body and the like.

[6] In the method of manufacturing a silicon carbide semiconductor device of the present invention, it is preferable that a thickness of the thin metal film formed in the thin metal film forming step fall within a range of from 50 nm to 350 nm.

[7] In the method of manufacturing a silicon carbide semiconductor device of the present invention, it is preferable that the laser beam irradiating step be started under a condition that an amount of a laser beam which arrives at a depth position of 50 nm from a boundary face between the silicon carbide semiconductor base body and the thin metal film is 10% or less.

[8] In the method of manufacturing a silicon carbide semiconductor device of the present invention, it is preferable that, in the etching step, silicon oxide possibly formed on the surface side of the metal carbide be also removed by etching by the non-oxidizing chemical solution.

[9] In the method of manufacturing a silicon carbide semiconductor device of the present invention, it is preferable that the polishing step be performed such that an arithmetic average roughness Ra of the second main surface falls within a range of from 30 nm to 300 nm.

[10] In the method of manufacturing a silicon carbide semiconductor device of the present invention, it is preferable that the laser beam irradiating step be performed under a condition that the laser beam is not irradiated onto a scribe line.

[11] A silicon carbide semiconductor device of the present invention includes: a silicon carbide semiconductor base body having a first main surface which is an element forming surface, and a second main surface which is a surface on a side opposite to the first main surface and is an uneven surface; a metal carbide formed on the second main surface of the silicon carbide semiconductor base body; and an electrode layer formed (positioned) on the metal carbide.

Advantage of Invention

According to the method of manufacturing a silicon carbide semiconductor device of the present invention, a metal carbide is formed by irradiating a laser beam which falls within a visible region or within an infrared region to a thin metal film made of metal capable of forming a metal carbide so that an ohmic electrode can be formed and hence, there arises no problem of carbon precipitation.

Further, according to the present invention, in the method of manufacturing a silicon carbide semiconductor device, an attenuation coefficient of the thin metal film is higher in a visible region than in an ultraviolet region and hence, a metal carbonization reaction can be sufficiently accelerated whereby a resistance characteristic and an adhesive characteristic of an ohmic electrode are minimally deteriorated.

According to the present invention, in the method of manufacturing a silicon carbide semiconductor device, a device which irradiates a laser beam which falls within a visible region or within an infrared region is less costly than a device which irradiates a laser beam which falls within an ultraviolet region and hence, a manufacturing cost becomes low compared to a conventional method of manufacturing a silicon carbide semiconductor device.

As a result, the method of manufacturing a silicon carbide semiconductor device of the present invention is a method of manufacturing a silicon carbide semiconductor device capable of manufacturing an ohmic electrode having an excellent resistance characteristic and an excellent adhesive characteristic at a low manufacturing cost without causing a problem of carbon precipitation.

Further, the silicon carbide semiconductor device according to the present invention can be manufactured by the above-mentioned method of manufacturing a silicon carbide semiconductor device and hence, it is possible to provide an inexpensive silicon carbide semiconductor device which includes an ohmic electrode having an excellent resistance characteristic and an excellent adhesive characteristic without causing a problem of carbon precipitation.

BRIEF DESCRIPTION OF DRAWINGS

In FIG. 1A to FIG. 2D, the illustration of the peripheral withstand voltage structure is omitted for simplifying the drawings.

In FIG. 4A to FIG. 5D, the illustration of the peripheral withstand voltage structure is omitted for simplifying the drawings.

In FIG. 6A to FIG. 7D, the illustration of the element structure and the peripheral withstand voltage structure is omitted for simplifying the drawings.

In FIG. 8A to FIG. 9C, the illustration of the element structure is omitted for simplifying the drawings.

In FIG. 10A to FIG. 11C, the illustration of the element structure and the peripheral withstand voltage structure is omitted for simplifying the drawings.

DESCRIPTION OF EMBODIMENTS

Figure 1A:
FIG. 1A to FIG. 1D are views describing respective steps of a method of manufacturing a silicon carbide semiconductor device according to an embodiment 1.

Hereinafter, a semiconductor device according to the present invention is described with reference to embodiments shown in the drawings.

Embodiment 1

Figure 1B:
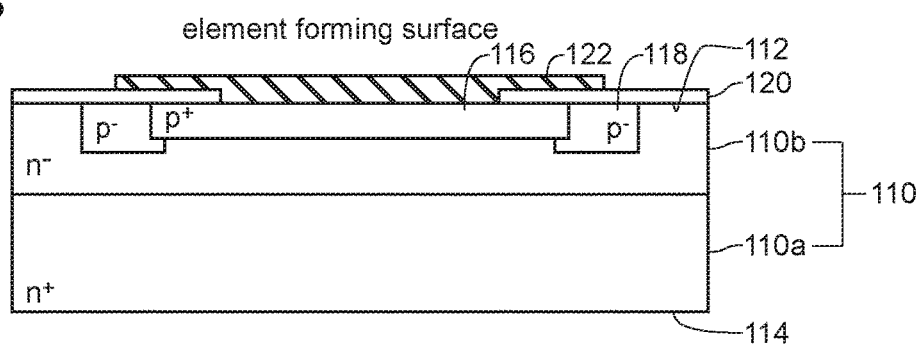
Figure 1C:
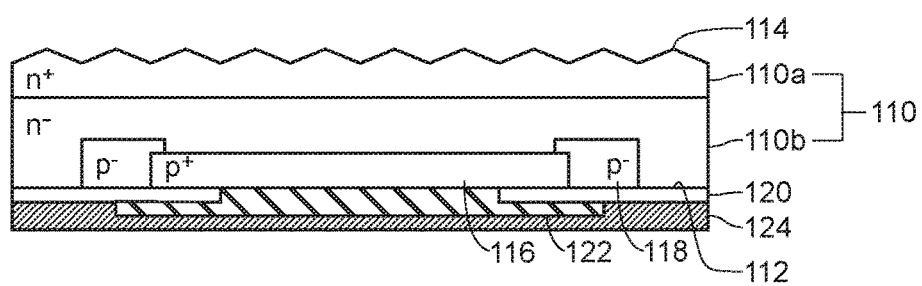
Figure 1D:
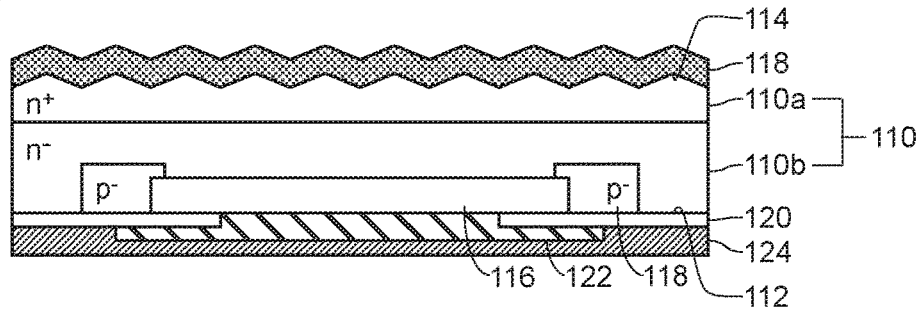

An embodiment 1 is an embodiment relating to a pn diode. A method of manufacturing a silicon carbide semiconductor device according to the embodiment 1 includes, in the following order: a silicon carbide semiconductor base body preparation step; a polishing step; a thin metal film forming step; a laser beam irradiating step; an etching step; and an electrode layer forming step. Hereinafter, the method of manufacturing a silicon carbide semiconductor device according to the embodiment 1 is described in detail with reference to FIG. 1A to FIG. 3.
<Method of Manufacturing Silicon Carbide Semiconductor Device>
1. Silicon Carbide Semiconductor Base Body Preparation Step The silicon carbide semiconductor base body preparation step is a step of preparing a silicon carbide semiconductor base body 110 which has a first main surface 112 forming an element forming surface and a second main surface 114 forming a surface opposite to the first main surface 112. First, a silicon carbide semiconductor base body 110 is formed by stacking an n⁻ type silicon carbide epitaxial layer 110b on an n⁻ type silicon carbide semiconductor substrate 110a. A p⁺ type diffusion layer 110c is formed on the silicon carbide semiconductor base body 110 by diffusing a p type impurity into the silicon carbide semiconductor base body 110 from a first main surface side of the silicon carbide semiconductor base body 110 (in this case, a surface side of a n⁻ type silicon carbide epitaxial layer 110b). Further, a peripheral withstand voltage structure not shown in the drawing is formed on the first main surface of the silicon carbide semiconductor base body 110 (in this case, the surface of the silicon carbide epitaxial layer 110b). With such a constitution, a pn junction and the peripheral withstand voltage structure are formed on the silicon carbide semiconductor base body 110 on a first main surface 112 side, and the first main surface 112 forms an element forming surface (see FIG. 1A and FIG. 1B). In this case, the pn junction and the peripheral withstand voltage structure correspond to the element according to the present invention.
2. Polishing Step Next, a protective film 116 for protecting the element is formed on the first main surface 112 of the silicon carbide semiconductor base body 110 and, thereafter, unevenness is formed on the second main surface 114 of the silicon carbide semiconductor base body 110 by polishing the silicon carbide semiconductor base body 110 from a second main surface 114 side (see FIG. 1C). At this stage of operation, the polishing step is performed such that an arithmetic average roughness Ra of the second main surface 114 is set to a value which falls within a range of from 30 nm to 300 nm.

The reason why the polishing step is performed such that the arithmetic average roughness Ra of the second main surface 114 is set to a value which falls within a range of from 30 nm to 300 nm is as follows. That is, when the arithmetic average roughness Ra of the second main surface 114 is set to 30 nm or more, a surface area of the second main surface becomes large and hence, metal carbonization reaction easily progresses in a laser beam irradiation step described later. Further, a laser beam is easily scattered in the laser beam irradiation step described later and hence, intensity of a green laser beam which reaches the first main surface 112 of the silicon carbide semiconductor base body 110 is decreased. As a result, a temperature of the element is not elevated so that the element is minimally broken. On the other hand, when the arithmetic average roughness Ra of the second main surface 114 exceeds 300 nm, the silicon carbide semiconductor base body 110 is liable to crack. Accordingly, it is not desirable to set the arithmetic average roughness Ra of the second main surface 114 to 300 nm or more. From the above-mentioned viewpoint, it is more preferable to perform the polishing step such that the arithmetic average roughness Ra of the second main surface 114 is set to a value which falls within a range of from 50 nm to 200 nm.

In the polishing step, simply, unevenness may be formed on the second main surface 114 of the silicon carbide semiconductor base body 110, or unevenness may be formed on the second main surface 114 of the silicon carbide semiconductor base body 110 while a thickness of the silicon carbide semiconductor base body 110 is reduced (for example, from 400 μm to 70 μm).
3. Thin Metal Film Forming Step Next, a thin metal film 118 made of metal capable of forming a metal carbide is formed on the second main surface 114 of the silicon carbide semiconductor base body 110 by a CVD method or a sputtering method (see FIG. 1D). In the embodiment 1, a thin Ti film is used as the thin metal film 118, and a film thickness of the thin metal film 118 is set to a value which falls within a range of from 50 nm to 350 nm.

The reason why the film thickness of the thin metal film 118 is set to a value which falls within a range of from 50 nm to 350 nm is as follows. That is, when the film thickness of the thin metal film 118 is set to a value less than 50 nm, there is a possibility that a sufficient amount of metal carbide for forming an ohmic electrode cannot be formed in the next laser beam irradiation step. Further, power of the thin metal film 118 for attenuating the green laser beam is weak and hence, intensity of the green laser beam which arrives at the first main surface 112 of the silicon carbide semiconductor base body 110 is increased. As a result, a temperature of the element is elevated so that the element is liable to be easily broken. Accordingly, it is not desirable to set the film thickness of the thin metal film 118 to a value less than 50 nm. On the other hand, when the film thickness of the thin metal film 118 is set to a value more than 350 nm, intensity of the green laser beam arriving at a boundary face between the silicon carbide semiconductor base body 110 and the thin metal film 118 is decreased. As a result, there is a possibility that a sufficient amount of metal carbide for forming an ohmic electrode cannot be formed. Accordingly, it is not desirable to set the film thickness of the thin metal film 118 to a value larger than 350 nm. From the above-mentioned viewpoint, it is more preferable to set the film thickness of the thin metal film 118 to a value which falls within a range of from 150 nm to 250 nm.

4. Laser Beam Irradiation Step

Figure 2A:
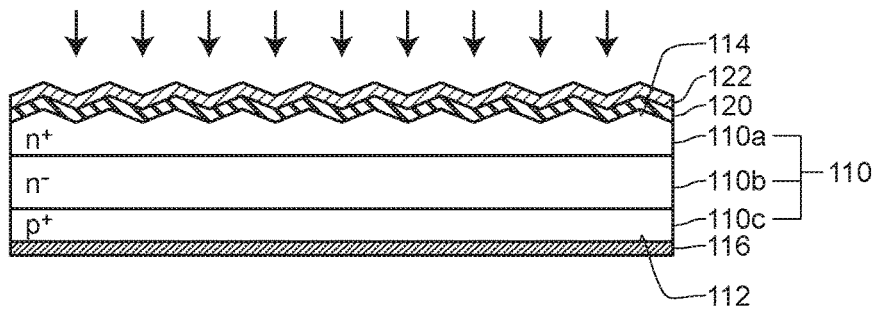
FIG. 2A to FIG. 2D are views describing respective steps of the method of manufacturing a silicon carbide semiconductor device according to the embodiment 1.

Next, a laser beam which falls within a visible region or within an infrared region is irradiated to the thin metal film 118 from a second main surface 114 side of the silicon carbide semiconductor base body 110 so as to heat the thin metal film 118 thus forming a metal carbide 120 on a boundary face between the silicon carbide semiconductor base body 110 and the thin metal film 118 (see FIG. 2A). In the embodiment 1, a laser beam which falls within a visible region (for example, a green laser beam having a wavelength of 532 nm) is used as the laser beam which falls within a visible region or within an infrared region. In the embodiment 1, the metal carbide 120 forms an ohmic electrode 124.

The metal carbide 120 may be a layered metal carbide (that is, a metal carbide layer) or a granular metal carbide (that is, metal carbide grains). In both cases, the metal carbide 120 functions as the ohmic electrode 124. In the laser beam irradiation step, there may be a case where a metal containing byproduct layer 122 is formed such that the metal containing byproduct layer 122 covers the metal carbide 120 (see FIG. 2A). Such a metal containing byproduct layer 122 can be removed in the subsequent etching step. Further, in the laser beam irradiation step, there may be a case where silicon oxide is formed (not shown in the drawing) together with the metal containing byproduct layer 122. Such a silicon oxide film can be also removed in the subsequent etching step.

A condition of the laser beam irradiation step is set such that the metal carbide 120 is formable on a boundary face between the silicon carbide semiconductor base body 110 and the thin metal film 118, and a temperature of a first main surface 112 side of the silicon carbide semiconductor base body 110 at the time of forming the metal carbide 120 remains at or below a maximum process temperature at the time of forming the element by a laser beam which passes through the thin metal film 118. As such a condition, power of a laser beam, a wavelength of a laser beam, a spot diameter of a laser beam, a throttle angle of a laser beam, a material for forming the thin metal film 118, a thickness of the thin metal film 118, a thickness of the silicon carbide semiconductor base body 110 and the like can be exemplified. In the laser beam irradiation step, the laser beam irradiation step is started under a condition that an amount of a laser beam which arrives at a depth position of 50 nm from the boundary face between the silicon carbide semiconductor base body 110 and the thin metal film 118 is 10% or less, and is more preferably 1% or less.

5. Etching Step

Figure 2B:
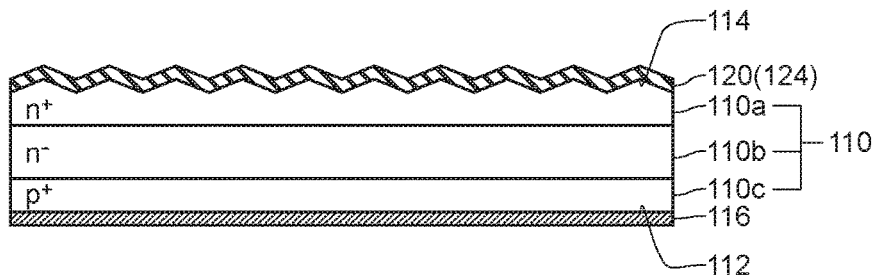

As described above, the metal containing byproduct layer 122 (and the silicon oxide film) which is/are possibly formed on a surface side of the metal carbide 120 is/are removed by etching using a non-oxidizing chemical solution thus exposing a surface of the metal carbide 120 (see FIG. 2B). Due to such an operation, in the subsequent electrode forming step, a back metal (a cathode electrode 126 in this case) can be formed on the second main surface 114 of the silicon carbide semiconductor base body 110 with the metal carbide 120 (ohmic electrode 124) interposed therebetween.

As a non-oxidizing chemical solution used in the etching step, a hydrofluoric acid group chemical agent (for example, a dilute hydrofluoric acid) may be used.

6. Electrode Layer Forming Step

Figure 2C:
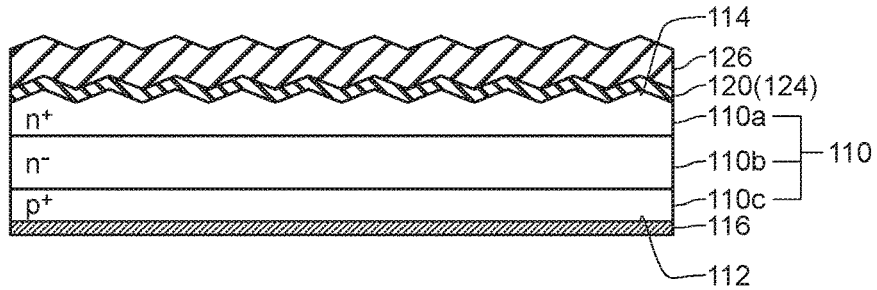

Next, a cathode electrode 126 is formed on the second main surface 114 of the silicon carbide semiconductor base body 110 with the metal carbide 120 (ohmic electrode 124) interposed therebetween (see FIG. 2C). As the cathode electrode 126, a film formed by stacking layers of Ti, Ni and Ag is used, for example. Due to such a configuration, the back metal (the cathode electrode 126 in this case) and the silicon carbide semiconductor base body 110 are electrically connected with each other with the metal carbide 120 (ohmic electrode 124) interposed therebetween. Then, the protective film 116 is removed from the first main surface 112 of the silicon carbide semiconductor base body 110 and, at the same time, an anode electrode 128 is formed on the first main surface 112 of the silicon carbide semiconductor base body 110 (see FIG. 2D). Ti is favorably used for forming the anode electrode 128.

The silicon carbide semiconductor device (pn diode) 100 according to the embodiment 1 can be manufactured by carrying out the above-mentioned steps.

<Silicon Carbide Semiconductor Device>

Figure 2D:
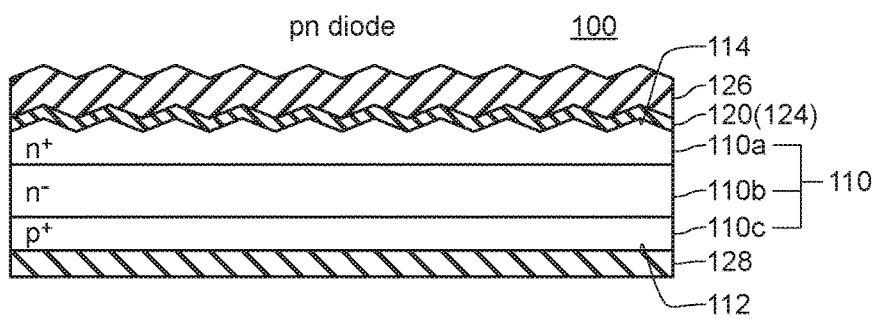
Figure 3:
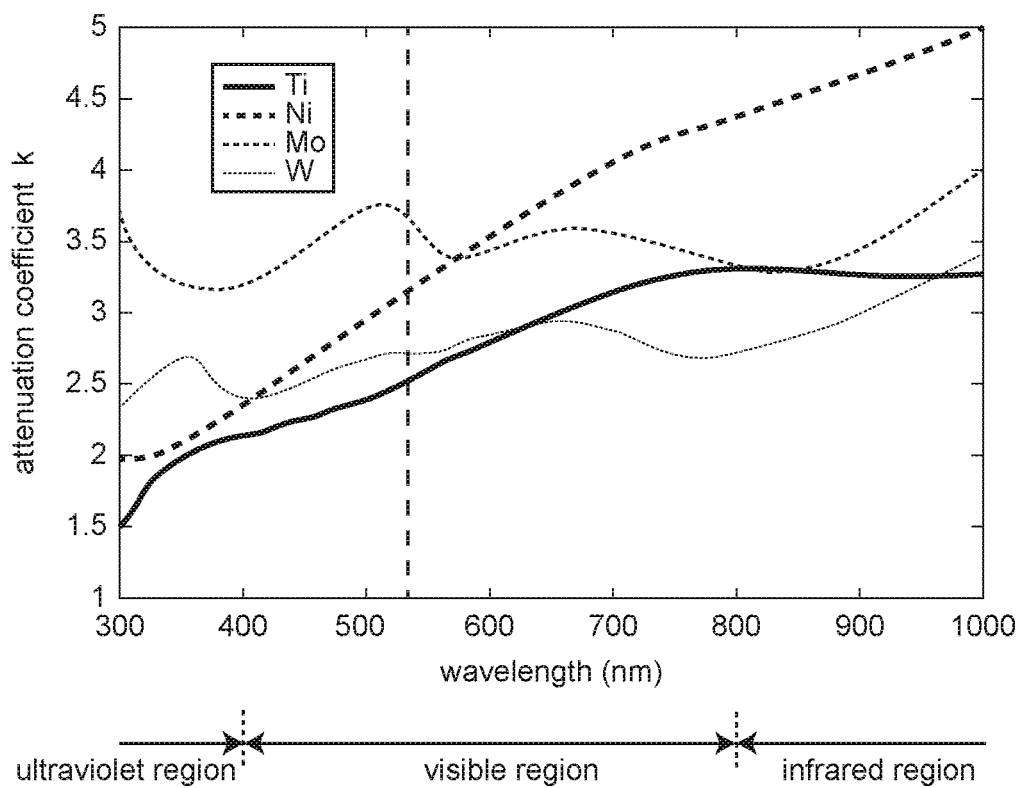
FIG. 3 is a graph showing attenuation coefficients of metals (Ti, Ni, Mo, W) in an ultraviolet region, in a visible region and a near infrared region.

As shown in FIG. 2D, the silicon carbide semiconductor device 100 according to the embodiment 1 includes: the silicon carbide semiconductor base body 110 having the first main surface 112 which is an element forming surface, and the second main surface 114 which is a surface on a side opposite to the first main surface 112 and is an uneven surface; the metal carbide 120 formed (positioned) on the second main surface 114 of the silicon carbide semiconductor base body 110; the electrode layer (cathode electrode) 126 formed (positioned) on the metal carbide 120; and an anode electrode 128 formed (positioned) on the first main surface 112 of the silicon carbide semiconductor base body 110.

<Advantageous Effects of Method of Manufacturing Silicon Carbide Semiconductor Device>

In the method of manufacturing a silicon carbide semiconductor device according to the embodiment 1, the metal carbide 120 is formed by irradiating a laser beam (a green laser beam) which falls within a visible region or within an infrared region to the thin metal film 118 (Ti thin film) made of metal capable of forming metal carbide so that the ohmic electrode 124 can be formed and hence, there arises no problem on carbon precipitation.

Further, in the method of manufacturing a silicon carbide semiconductor device according to the embodiment 1, an attenuation coefficient of the thin metal film 118 (Ti thin film) is higher in a visible region than in an ultraviolet region (see FIG. 3) and hence, a metal carbonization reaction can be sufficiently accelerated whereby a resistance characteristic and an adhesive characteristic of an ohmic electrode are minimally deteriorated.

Still further, in the method of manufacturing a silicon carbide semiconductor device according to the embodiment 1, a device which irradiates a laser beam (a green laser beam) which falls within a visible region or within an infrared region is less costly than a device which irradiates a laser beam which falls within an ultraviolet region and hence, a manufacturing cost becomes low compared to a conventional method of manufacturing a silicon carbide semiconductor device.

As a result, the method of manufacturing a silicon carbide semiconductor device according to the embodiment 1 is a method of manufacturing a silicon carbide semiconductor device capable of manufacturing an ohmic electrode having an excellent resistance characteristic and an excellent adhesive characteristic at a low manufacturing cost without causing a problem of carbon precipitation.

In the method of manufacturing a silicon carbide semiconductor device according to the embodiment 1, the thin metal film 118 is heated not by a laser beam which falls within an ultraviolet region but by a laser beam which falls within a visible region or within an infrared region and hence, an amount of a laser beam which passes through the thin metal film 118 is decreased, and absorptivity of a laser beam by the silicon carbide semiconductor base body 110 is also decreased. As a result, a degree that the silicon carbide semiconductor base body 110 per se is heated by a laser beam which passes through the thin metal film 118 becomes small so that an amount of carbon generated from the silicon carbide semiconductor base body 110 can be decreased.

In the method of manufacturing a silicon carbide semiconductor device according to the embodiment 1, the thin metal film 118 is formed of a Ti thin film. That is, metal capable of forming a metal carbide is Ti and hence, unlike the case where metal capable of forming metal carbide is W or Mo, the metal containing byproduct layer 122 (containing Ti, TiSix or the like) can be removed by etching without using an oxidizing chemical solution. As a result, a surface of the metal carbide 120 is minimally oxidized and hence, adhesiveness between the metal carbide 120 and the back metal (in this case, the cathode electrode 126) is minimally deteriorated.

In the method of manufacturing a silicon carbide semiconductor device according to the embodiment 1, the laser beam irradiation step is performed using a green laser beam (wavelength: 532 nm, a wave having a wavelength twice as large as a wavelength of YAG laser beam) having a larger attenuation coefficient for the thin metal film 118 than that of a laser beam which falls within an ultraviolet region as a laser beam which falls within a visible region or within an infrared region. Accordingly, it is possible to efficiently transform the thin metal film 118 into the metal carbide 120 by efficiently heating the thin metal film 118. Accordingly, an amount of a laser beam which arrives at the silicon carbide semiconductor base body 110 can be decreased so that the influence which the laser beam exerts on the element can be decreased.

Further, in the method of manufacturing a silicon carbide semiconductor device according to the embodiment 1, a Ti thin film having a film thickness which falls within a range of from 50 nm to 350 nm is used as the thin metal film 118 and hence, a sufficient amount of metal carbide 120 as the ohmic electrode 124 can be stably formed, and the occurrence of a phenomenon that a temperature of the element becomes high so that the element is broken can be suppressed.

<Effect of Silicon Carbide Semiconductor Device>

As described above, the silicon carbide semiconductor device according to the embodiment 1 can be manufactured by the method of manufacturing a silicon carbide semiconductor device according to the embodiment 1. Accordingly, it is possible to provide an inexpensive silicon carbide semiconductor device which includes an ohmic electrode having an excellent resistance characteristic and an excellent adhesive characteristic without causing a problem of carbon precipitation.

Embodiment 2

A method of manufacturing a silicon carbide semiconductor device according to an embodiment 2 basically includes substantially the same steps as the method of manufacturing a silicon carbide semiconductor device according to the embodiment 1. However, the method of manufacturing a silicon carbide semiconductor device according to the embodiment 2 differs from the method of manufacturing a silicon carbide semiconductor device according to the embodiment 1 with respect to a point that a silicon carbide semiconductor device to be manufactured is not a pn diode but is a Schottky barrier diode.

In this manner, the method of manufacturing a silicon carbide semiconductor device according to the embodiment 2 differs from the method of manufacturing a silicon carbide semiconductor device according to the embodiment 1 with respect to the point that a silicon carbide semiconductor device to be manufactured is not a pn diode but is a Schottky barrier diode. However, a metal carbide is formed by irradiating a laser beam (a green laser beam) which falls within a visible region or within an infrared region to the thin metal film (Ti thin film) made of metal capable of forming metal carbide so that the ohmic electrode can be formed. Accordingly, in the same manner as the method of manufacturing a silicon carbide semiconductor device according to the embodiment 1, it is possible to provide a method of manufacturing a silicon carbide semiconductor device capable of manufacturing an ohmic electrode having an excellent resistance characteristic and an excellent adhesive characteristic at a low manufacturing cost without causing a problem of carbon precipitation.

The method of manufacturing a silicon carbide semiconductor device according to the embodiment 2 includes: a silicon carbide semiconductor base body preparation step; a polishing step; a thin metal film forming step; a laser beam irradiating step; an etching step; and an electrode layer forming step which are performed in this order. Hereinafter, the method of manufacturing a silicon carbide semiconductor device according to the embodiment 2 is described in detail with reference to FIG. 4A to FIG. 5B.

1. Silicon Carbide Semiconductor Base Body Preparation Step

The silicon carbide semiconductor base body preparation step is a step of preparing a silicon carbide semiconductor base body which includes a first main surface forming an element forming surface and a second main surface forming a surface opposite to the first main surface. First, a silicon carbide semiconductor base body 210 is formed by stacking an $n^-$ type silicon carbide epitaxial layer 210b on an $n^+$ type silicon carbide semiconductor substrate 210a. A Schottky metal layer 215 which forms a Schottky junction with an $n^-$ type silicon carbide epitaxial layer 210b is formed on a first main surface 212 of the silicon carbide semiconductor base body 210. Further, a peripheral withstand voltage structure not shown in the drawing is formed on the first main surface 212 of the silicon carbide semiconductor base body 210.

Figure 4A:
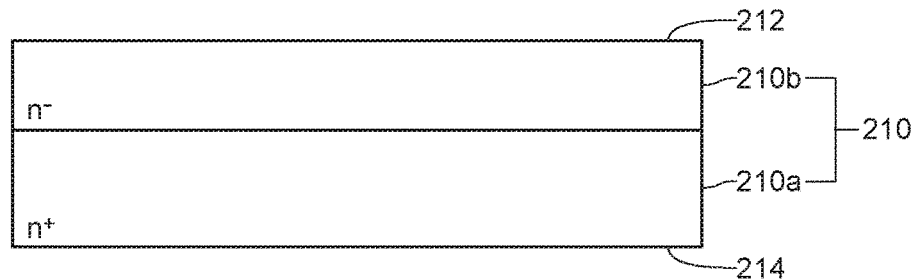
FIG. 4A to FIG. 4D are views describing respective steps of a method of manufacturing a silicon carbide semiconductor device according to an embodiment 2.
Figure 4B:
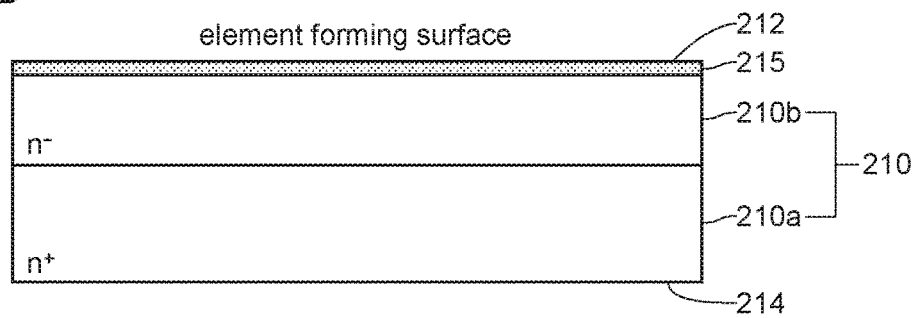

With such a configuration, a Schottky junction and the peripheral withstand voltage structure are formed on the silicon carbide semiconductor base body 210 on a first main surface 212 side, and the first main surface 212 forms an element forming surface (see FIG. 4A and FIG. 4B). In this case, the Schottky junction and the peripheral withstand voltage structure correspond to the element according to the present invention.

2. Polishing Step

Figure 4C:
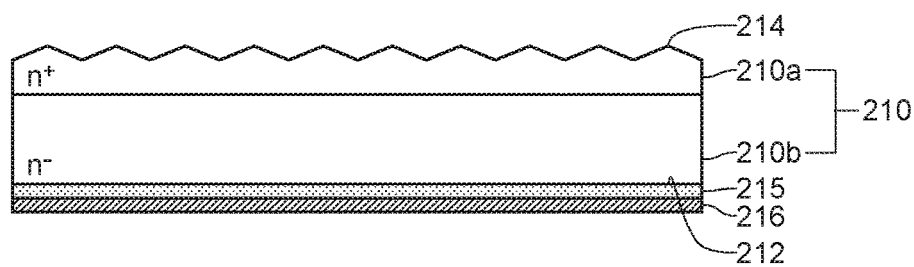

Next, in substantially the same manner as the case of the embodiment 1, a protective film 216 for protecting an element is formed on the first main surface 212 of the silicon carbide semiconductor base body 210 and, thereafter, unevenness is formed on a second main surface 214 of the silicon carbide semiconductor base body 210 by polishing the silicon carbide semiconductor base body 210 from a second main surface 214 side (see FIG. 4C).

3. Thin Metal Film Forming Step

Figure 4D:
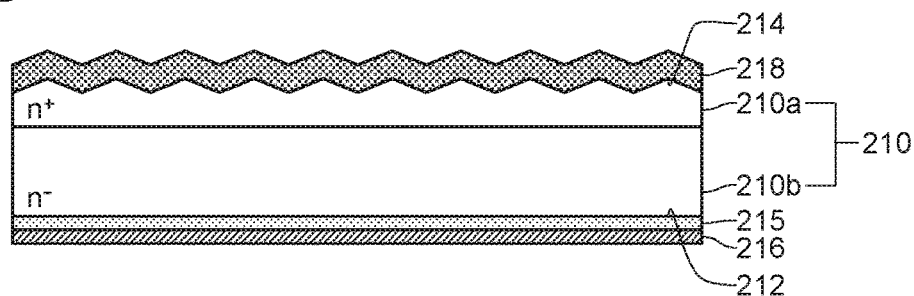

Next, in substantially the same manner as the case of the embodiment 1, a thin metal film 218 made of metal capable of forming a metal carbide is formed on the second main surface 214 of the silicon carbide semiconductor base body 210 by a CVD method or a sputtering method (see FIG. 4D).

4. Laser Beam Irradiation Step

Figure 5A:
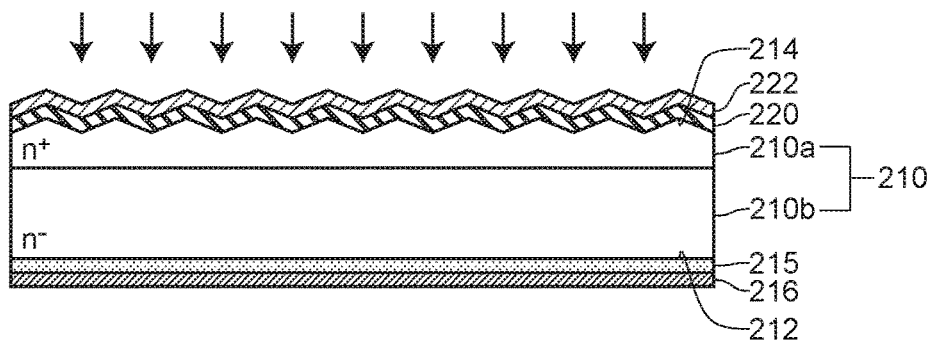
FIG. 5A to FIG. 5D are views describing respective steps of the method of manufacturing a silicon carbide semiconductor device according to the embodiment 2.

Next, in substantially the same manner as the case of the embodiment 1, the thin metal film 218 is heated by irradiating a laser beam which falls within a visible region or within an infrared region to the thin metal film 218 from a second main surface 214 side of the silicon carbide semiconductor base body 210 thus forming a metal carbide 220 on a boundary face between the silicon carbide semiconductor base body 210 and the thin metal film 218 (see FIG. 5A).

5. Etching Step

Figure 5B:
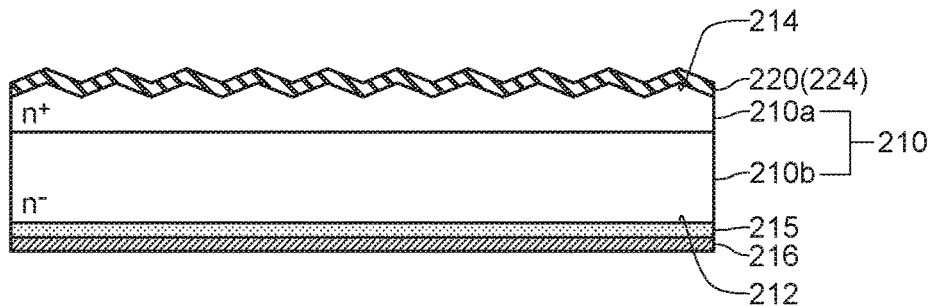

Next, in substantially the same manner as the case of the embodiment 1, a metal containing byproduct layer 222 (and a silicon oxide film) possibly formed on a surface side of the metal carbide 220 as described above is removed by etching using a non-oxidizing chemical solution thus exposing a surface of the metal carbide 220 (see FIG. 5B).

6. Electrode Layer Forming Step

Figure 5C:
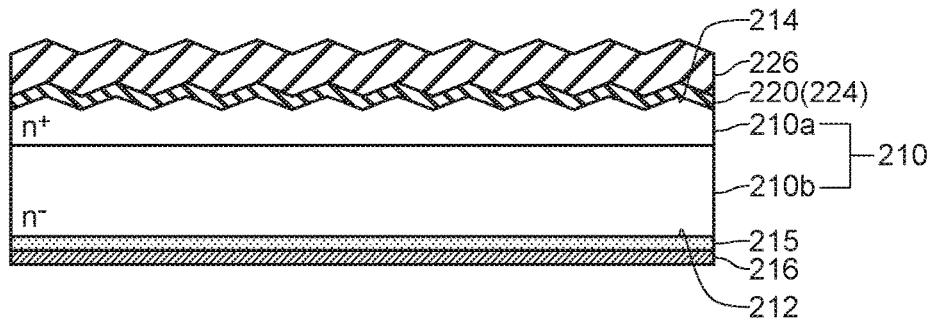
Figure 5D:
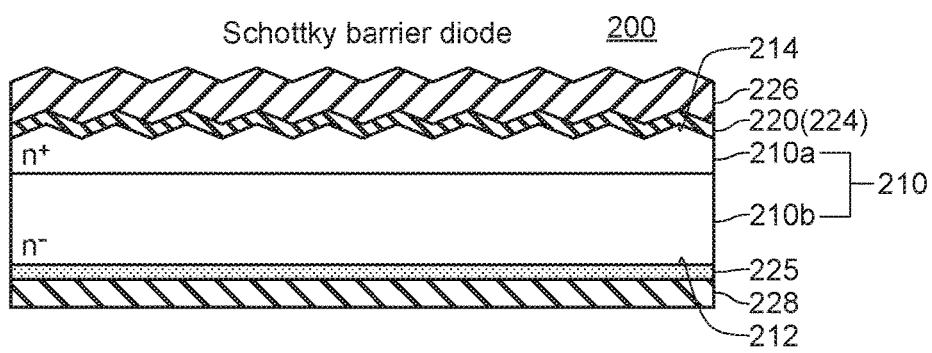

Next, in substantially the same manner as the case of the embodiment 1, a cathode electrode 226 is formed on the second main surface 214 of the silicon carbide semiconductor base body 210 with the metal carbide 220 (ohmic electrode 224) interposed therebetween (see FIG. 5C). As the cathode electrode 226, a film formed by stacking layers of Ti, Ni and Ag is used, for example. Due to such a configuration, the back metal (the cathode electrode 226 in this case) and the silicon carbide semiconductor base body 210 are electrically connected with each other with the metal carbide 220 (ohmic electrode 224) interposed therebetween. Then, the protective film 216 is removed from the first main surface 212 of the silicon carbide semiconductor base body 210 and, at the same time, an anode electrode 228 is formed on the first main surface 212 of the silicon carbide semiconductor base body 210 (see FIG. 5D).

The silicon carbide semiconductor device (Schottky barrier diode) 200 according to the embodiment 2 can be manufactured by carrying out the above-mentioned steps.

Embodiment 3

A method of manufacturing a silicon carbide semiconductor device according to an embodiment 3 basically includes the substantially same steps as the method of manufacturing a silicon carbide semiconductor device according to the embodiment 1. However, the method of manufacturing a silicon carbide semiconductor device according to the embodiment 3 differs from the method of manufacturing a silicon carbide semiconductor device according to the embodiment 1 with respect to a point that a silicon carbide semiconductor device to be manufactured is not a pn diode but is a power MOSFET.

In this manner, the method of manufacturing a silicon carbide semiconductor device according to the embodiment 3 differs from the method of manufacturing a silicon carbide semiconductor device according to the embodiment 1 with respect to the point that a silicon carbide semiconductor device to be manufactured is not a pn diode but is a power MOSFET. However, the metal carbide is formed by irradiating a laser beam (a green laser beam) which falls within a visible region or within an infrared region to the thin metal film (Ti thin film) made of metal capable of forming a metal carbide so that the ohmic electrode can be formed. Accordingly, in the same manner as the method of manufacturing a silicon carbide semiconductor device according to the embodiment 1, it is possible to provide a method of manufacturing a silicon carbide semiconductor device capable of manufacturing an ohmic electrode having an excellent resistance characteristic and an excellent adhesive characteristic at a low manufacturing cost without causing a problem of carbon precipitation.

The method of manufacturing a silicon carbide semiconductor device according to the embodiment 3 includes, in the following order: a silicon carbide semiconductor base body preparation step; a polishing step; a thin metal film forming step; a laser beam irradiating step; an etching step; and an electrode layer forming step which are performed. Hereinafter, the method of manufacturing a silicon carbide semiconductor device according to the embodiment 3 is described in detail with reference to FIG. 6A to FIG. 7D.

<Method of Manufacturing Silicon Carbide Semiconductor Device>

1. Silicon Carbide Semiconductor Base Body Preparation Step

The silicon carbide semiconductor base body preparation step is a step of preparing a silicon carbide semiconductor base body 310 which includes a first main surface 312 forming an element forming surface and a second main surface 314 forming a surface on a side opposite to the first main surface 312. First, the silicon carbide semiconductor base body 310 where a $p^+$ type semiconductor layer not shown in the drawing is formed on an $n^-$ type silicon carbide semiconductor substrate on one surface (second main surface) side is prepared. Then, a MOS structure not shown in the drawing (a p type body region, a $p^+$ type body contact region, an $n^+$ type source region, a gate insulation layer, a gate electrode, a protective insulation layer, a source electrode and the like) and a peripheral withstand voltage structure not shown in the drawing are formed on the silicon carbide semiconductor base body 310 on a first main surface 312 side. The first main surface 312 forms an element forming surface (see FIG. 6A and FIG. 6B). In this case, the above-mentioned MOS structure and the peripheral withstand voltage structure correspond to the element according to the present invention.

2. Polishing Step

Figure 6A:
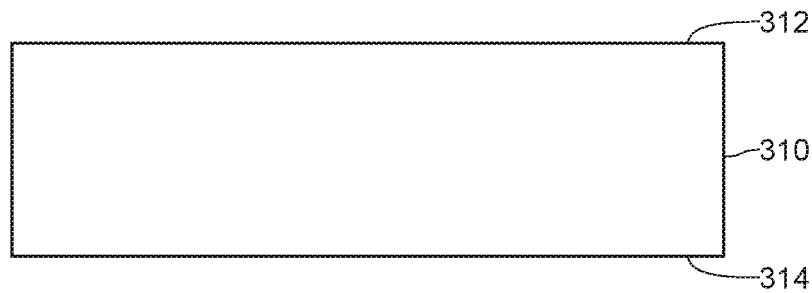
FIG. 6A to FIG. 6D are views describing respective steps of a method of manufacturing a silicon carbide semiconductor device according to an embodiment 3.
Figure 6B:
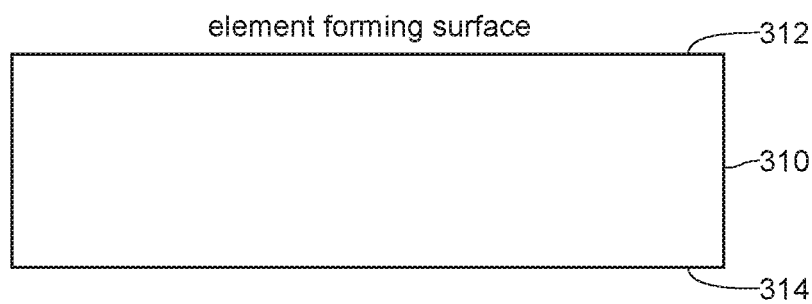
Figure 6C:
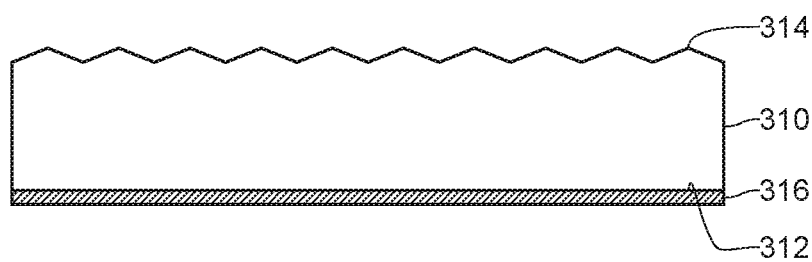

Next, in substantially the same manner as the case of the embodiment 1, after a protective film 316 for protecting the element is formed on the first main surface 312 of the silicon carbide semiconductor base body 310, unevenness is formed on a second main surface 314 of the silicon carbide semiconductor base body 310 by polishing the silicon carbide semiconductor base body 310 from a second main surface 314 side (see FIG. 6C).

3. Thin Metal Film Forming Step

Figure 6D:
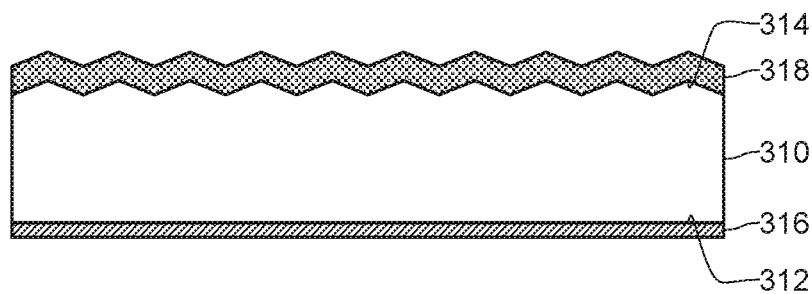

Next, in substantially the same manner as the case of the embodiment 1, a thin metal film 318 made of metal capable of forming a metal carbide is formed on the second main surface 314 of the silicon carbide semiconductor base body 310 by a CVD method or a sputtering method (see FIG. 6D).

4. Laser Beam Irradiation Step

Figure 7A:
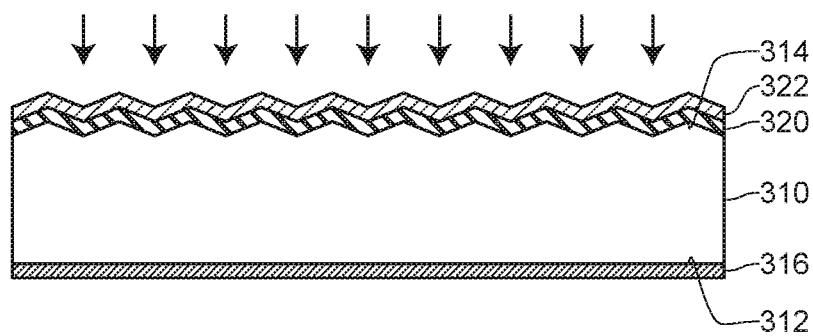
FIG. 7A to FIG. 7D are views describing respective steps of the method of manufacturing a silicon carbide semiconductor device according to the embodiment 3.

Next, in the same manner as the case of the embodiment 1, the thin metal film 318 is heated by irradiating a laser beam which falls within a visible region or within an infrared region to the thin metal film 318 from a second main surface 314 side of the silicon carbide semiconductor base body 310 thus forming a metal carbide 320 on a boundary face between the silicon carbide semiconductor base body 310 and the thin metal film 318 (see FIG. 7A).

5. Etching Step

Figure 7B:
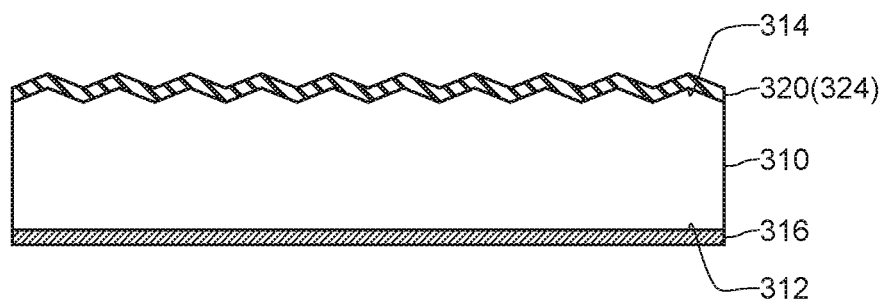

Next, in substantially the same manner as the case of the embodiment 1, a metal containing byproduct layer 322 (and a silicon oxide film) possibly formed on a surface side of the metal carbide 320 as described above is removed by etching using a non-oxidizing chemical solution thus exposing a surface of the metal carbide 320 (see FIG. 7B).

6. Electrode Layer Forming Step

Figure 7C:
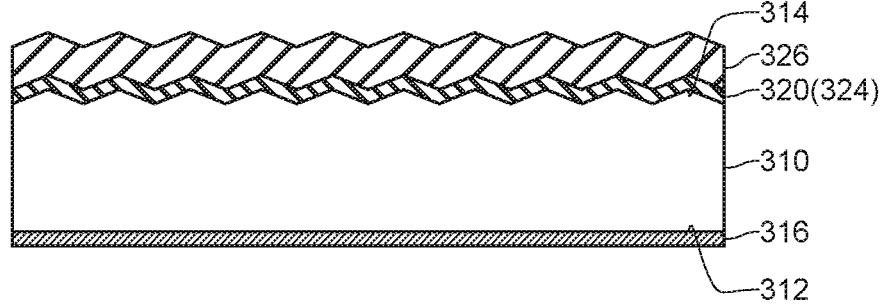

Next, in substantially the same manner as the case of the embodiment 1, a drain electrode 326 is formed on the second main surface 314 of the silicon carbide semiconductor base body 310 with the metal carbide 320 (ohmic electrode 324) interposed therebetween (see FIG. 7C). As the drain electrode 326, a film formed by stacking layers of Ti, Ni and Ag is used, for example. Due to such a configuration, the back metal (the drain electrode 326 in this case) and the silicon carbide semiconductor base body 310 are electrically connected with each other with the metal carbide 320 (ohmic electrode 324) interposed therebetween. Then, the protective film 316 is removed from the first main surface 312 of the silicon carbide semiconductor base body 310 and, at the same time, a source electrode 328 and a gate pad electrode not shown in the drawing are formed on the first main surface 312 of the silicon carbide semiconductor base body 310 (see FIG. 7D).

The silicon carbide semiconductor device (planar type MOSFET) 300 according to the embodiment 3 can be manufactured by carrying out the above-mentioned steps.

<Silicon Carbide Semiconductor Device>

Figure 7D:
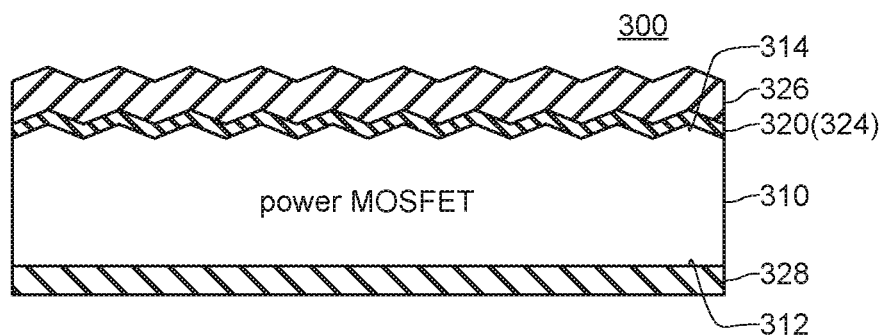

As shown in FIG. 7D, the silicon carbide semiconductor device 300 according to the embodiment 3 includes: the silicon carbide semiconductor base body 310 having the first main surface 312 which is an element forming surface, and the second main surface 314 which is a surface on a side opposite to the first main surface 312 and is an uneven surface; the metal carbide 320 formed (positioned) on the second main surface 314 of the silicon carbide semiconductor base body 310; and the electrode layer (drain electrode) 326 formed (positioned) on the metal carbide 320.

Embodiment 4

Figure 8A:
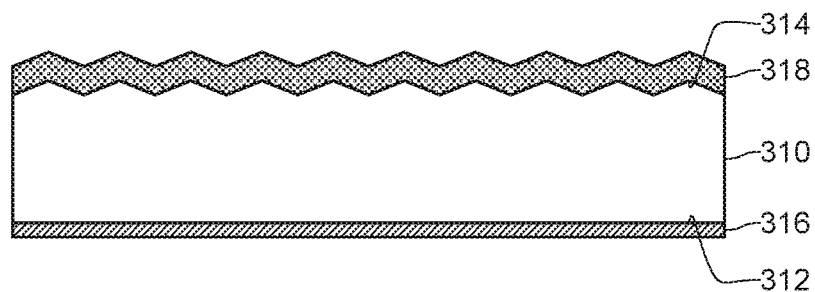
FIG. 8A to FIG. 8C are views describing respective steps of a method of manufacturing a silicon carbide semiconductor device according to an embodiment 4.
Figure 8B:
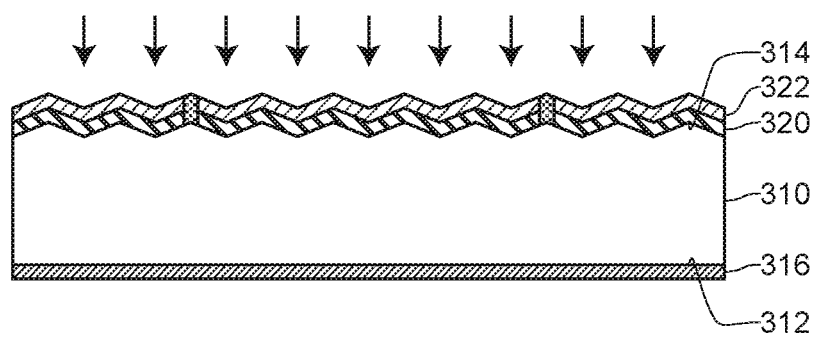
Figure 8C:
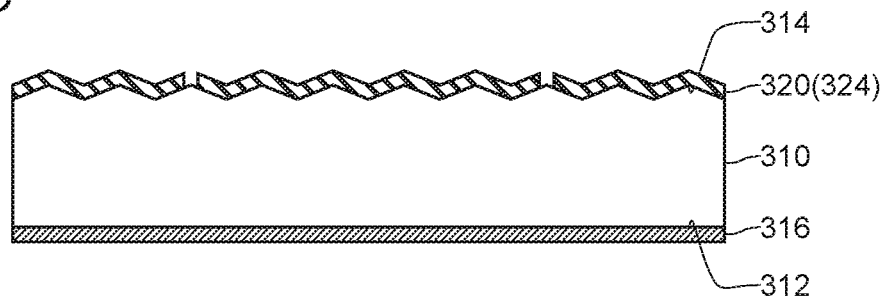

A method of manufacturing a silicon carbide semiconductor device according to an embodiment 4 basically includes substantially the same steps as the method of manufacturing a silicon carbide semiconductor device according to the embodiment 3. However, the method of manufacturing a silicon carbide semiconductor device according to the embodiment 4 differs from the method of manufacturing a silicon carbide semiconductor device according to the embodiment 3 with respect to the content of a laser beam irradiating step. That is, in the method of manufacturing a silicon carbide semiconductor device according to the embodiment 4, as shown in FIG. 8A and FIG. 8B, the laser beam irradiating step is performed under a condition that a laser beam is not irradiated onto scribe lines.

In this manner, the method of manufacturing a silicon carbide semiconductor device according to the embodiment 4 differs from the method of manufacturing a silicon carbide semiconductor device according to the embodiment 3 with respect to the content of the laser beam irradiating step. However, the metal carbide is formed by irradiating a laser beam (a green laser beam) which falls within a visible region or within an infrared region to the thin metal film (thin Ti film) made of metal capable of forming a metal carbide so that the ohmic electrode can be formed. Accordingly, in the same manner as the method of manufacturing a silicon carbide semiconductor device according to the embodiment 1, it is possible to provide a method of manufacturing a silicon carbide semiconductor device capable of manufacturing an ohmic electrode having an excellent resistance characteristic and an excellent adhesive characteristic at a low manufacturing cost without causing a problem of carbon precipitation.

The method of manufacturing a silicon carbide semiconductor device according to the embodiment 4 includes, in the following order: a silicon carbide semiconductor base body preparation step; a polishing step; a thin metal film forming step; a laser beam irradiating step; an etching step and an electrode layer forming step which are performed. Hereinafter, the method of manufacturing a silicon carbide semiconductor device according to the embodiment 4 is described in detail with reference to FIG. 8A to FIG. 9C.

1. Silicon Carbide Semiconductor Base Body Preparation Step

First, in the same manner as the case of the embodiment 3, the silicon carbide semiconductor base body preparation step is performed.

2. Polishing Step

Next, in the same manner as the case of the embodiment 3, the polishing step is performed.

3. Thin Metal Film Forming Step

Next, in substantially the same manner as the case of the embodiment 3, the thin metal film forming step is performed (see FIG. 8A).

4. Laser Beam Irradiation Step

Next, in substantially the same manner as the case of the embodiment 3, the laser beam irradiation step is performed. In the embodiment 4, as shown in FIG. 8B, the laser beam irradiating step is performed under a condition that a laser beam is not irradiated onto scribe lines. Accordingly, in regions not including the scribe lines, in substantially the same manner as the case of the embodiment 3, a metal carbide 320 and a metal containing byproduct layer 322 are formed on a silicon carbide semiconductor base body 310. On the scribe lines, a thin metal film 318 remains on the silicon carbide semiconductor base body 310 as it is.

5. Etching Step

Next, in substantially the same manner as the embodiment 3, the metal containing byproduct layer 322 (and a silicon oxide film) is removed by etching using a non-oxidizing chemical solution thus exposing a surface of the metal carbide 320. At this stage of processing, the thin metal film 318 is also removed by etching using a non-oxidizing chemical solution (see FIG. 8C).

6. Electrode Layer Forming Step

Figure 9A:
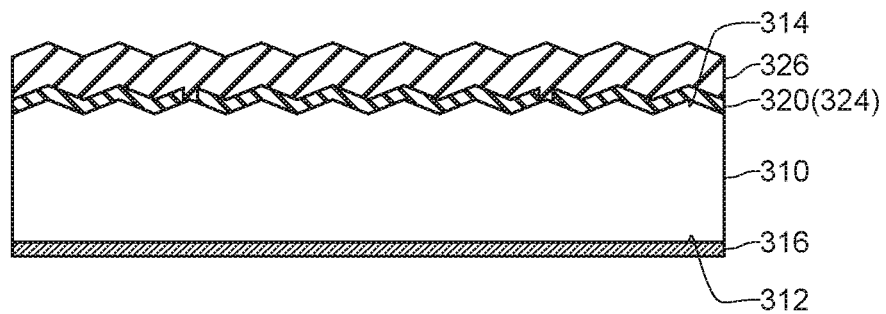
FIG. 9A to FIG. 9C are views describing respective steps of the method of manufacturing a silicon carbide semiconductor device according to the embodiment 4.
Figure 9B:
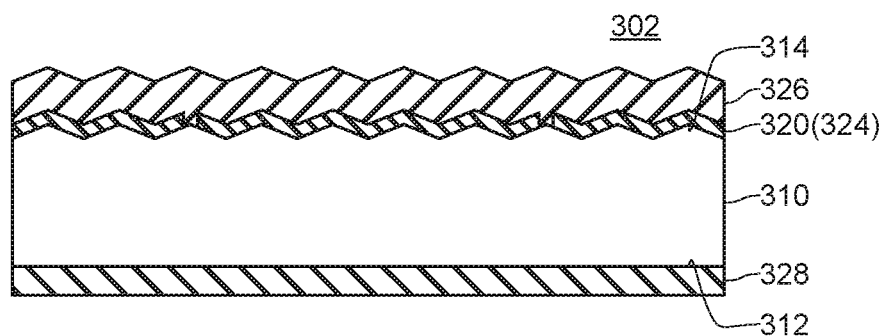
Figure 9C:
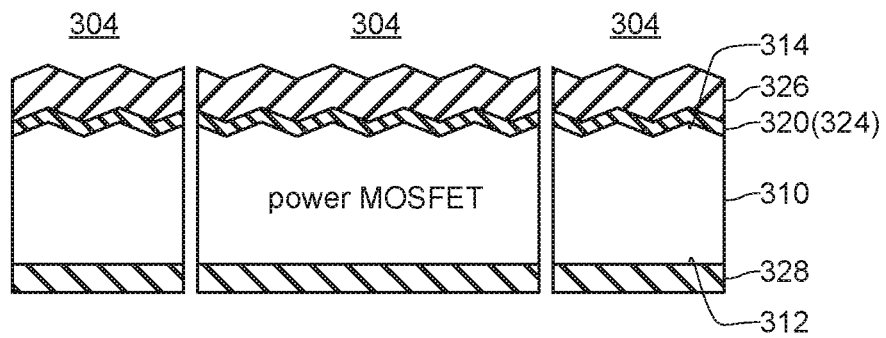
Figure 10A:
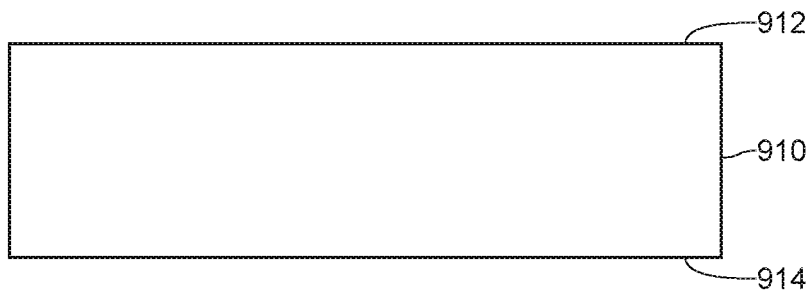
FIG. 10A to FIG. 10D are views describing respective steps of a conventional method of manufacturing a silicon carbide semiconductor device.
Figure 10B:
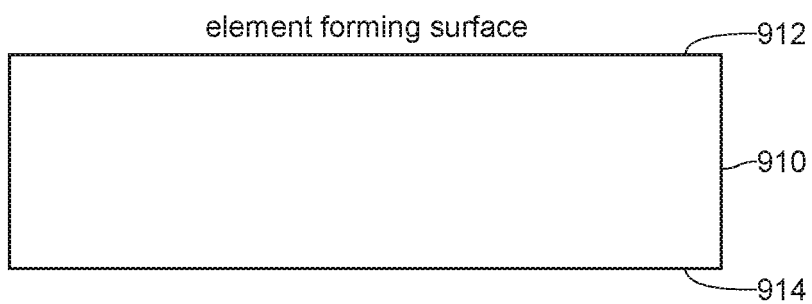
Figure 10C:
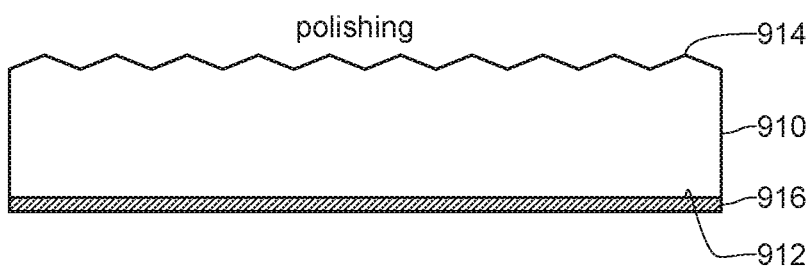
Figure 10D:
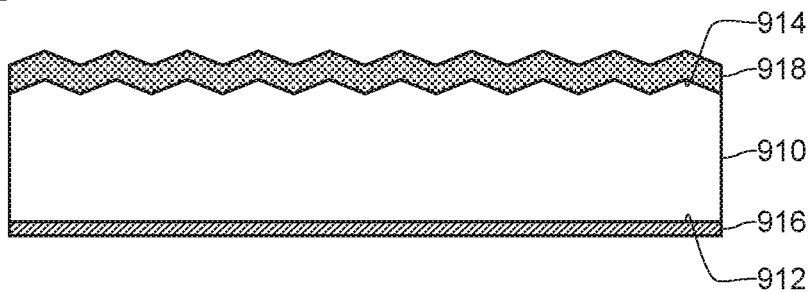
Figure 11A:
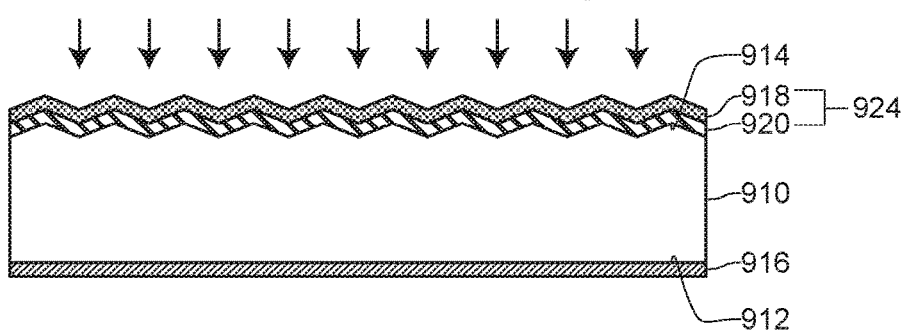
FIG. 11A to FIG. 11C are views describing respective steps of the conventional method of manufacturing a silicon carbide semiconductor device.
Figure 11B:
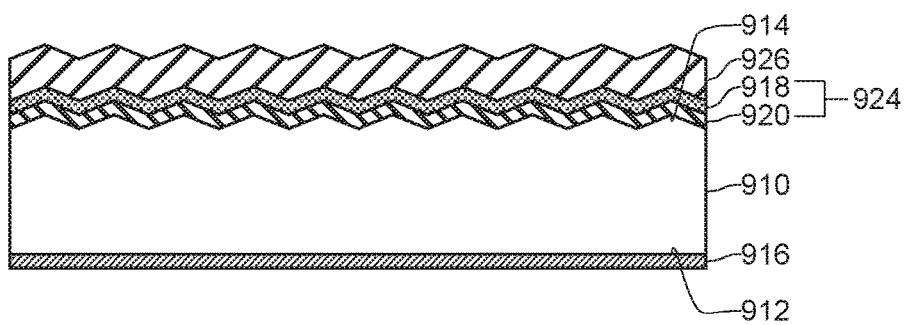
Figure 11C:
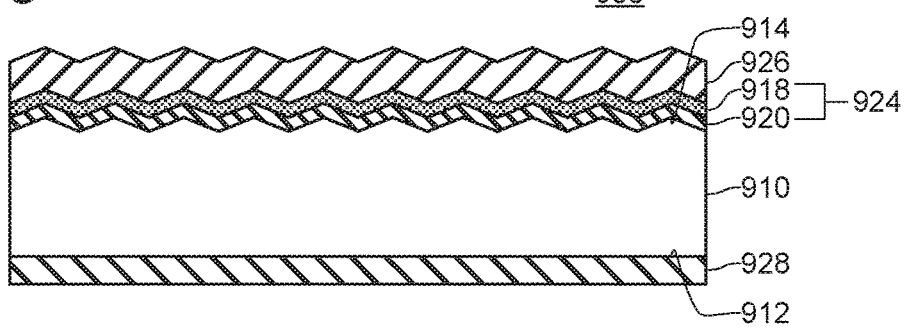

Next, in substantially the same manner as the case of the embodiment 3, the electrode layer forming step is performed (see FIG. 9A and FIG. 9B). In this manner, a wafer-shaped silicon carbide semiconductor device (planar-type MOSFET) 302 can be manufactured.

Thereafter, by cutting and dividing the wafer-shaped silicon carbide semiconductor device 302 along the scribe line, chip-shaped silicon carbide semiconductor devices 304 can be manufactured. At this stage of processing, a metal carbide is not present on the scribe lines and hence, an operation of cutting and dividing the wafer-shaped silicon carbide semiconductor device 102 can be easily performed.

Although the present invention has been described heretofore based on the above-mentioned embodiments, the present invention is not limited to the above-mentioned embodiments. Various modifications are conceivable without departing from the gist of the present invention and, for example, the following modifications are also conceivable.

(1) In the above-mentioned embodiment 1, although Ti is used as metal capable of forming a metal carbide, the present invention is not limited to such a metal. Provided that metal is capable of forming a metal carbide, a material other than Ti, for example, an alloy of Ti (for example, TiCx, TiSix, TiNx, TiOx or the like) may be used, and one or two or more metals selected from a group consisting of Ta, W, Mo, an alloy of Ta, an alloy of W, and an alloy of Mo may be also used.

(2) In the above-mentioned embodiment 1, a green laser beam (wavelength: 532 nm) is used as a laser beam which falls within a visible region or within an infrared region. However, the present invention is not limited to such a case. A laser beam which falls within a visible region and a laser beam which falls within an infrared region other than a green laser beam may be also used.

(3) In the above-mentioned embodiment 1, the present invention is described by taking a case where a pn diode is used as a silicon carbide semiconductor device as an example, and in the above-mentioned embodiment 2, the present invention is described by taking a case where a Schottky barrier diode is used as a silicon carbide semiconductor device as an example. However, the present invention is not limited to such cases. The present invention is also applicable to a passive-type power semiconductor device such as a thyristor in general.

(4) In the above-mentioned embodiments 3, 4, the present invention is described by taking a case where a planar-type power MOSFET is used as an example. However, the present invention is not limited to such a case. The present invention is also applicable to a trench-type power MOSFET, and the present invention is also generally applicable to an active-type power semiconductor device such as a planar-type or a trench-type IGBT.

REFERENCE SIGNS LIST 100, 200, 300, 302, 304: silicon carbide semiconductor device
110, 210, 310: silicon carbide semiconductor base body
112, 212, 312: first main surface
114, 214, 314: second main surface
116, 216, 316: protective film
118, 218, 318: thin metal film
120, 220, 320: metal carbide
122, 222, 322: metal containing byproduct layer
124, 224, 324: ohmic electrode
126, 226: cathode electrode
128, 228: anode electrode
215: Schottky metal layer
326: drain electrode
328: source electrode

The invention claimed is:

1. A method of manufacturing a silicon carbide semiconductor device comprising, in the following order:
   a silicon carbide semiconductor base body preparation step of preparing a silicon carbide semiconductor base body having a first main surface which is an element forming surface and a second main surface which is a surface on a side opposite to the first main surface;
   a polishing step of polishing the silicon carbide semiconductor base body from a second main surface side;
   a thin metal film forming step of forming a thin metal film made of at least one metal capable of forming a metal carbide on the second main surface of the silicon carbide semiconductor base body, said at least one metal including Ti;
   a laser beam irradiating step of irradiating a laser beam which falls within a visible region or within an infrared region to the thin metal film so as to heat the thin metal film thus forming a metal carbide on a boundary face between the silicon carbide semiconductor base body and the thin metal film,
   wherein the laser beam irradiating step is started under a condition that an amount of a laser beam which arrives at a depth position of 50 nm from a boundary face between the silicon carbide semiconductor base body and the thin metal film is 10% or less;
   an etching step of removing by etching a metal containing byproduct layer formed on a surface side of the metal carbide by a non-oxidizing chemical solution thus exposing a surface of the metal carbide; and
   an electrode layer forming step of forming an electrode layer on the metal carbide wherein
   the metal containing byproduct layer contains Ti and TiSix, and
   the etching step further removes Ti and TiSix.

2. The method of manufacturing a silicon carbide semiconductor device according to claim 1,
   wherein the at least one metal capable of forming the metal carbide further includes one or more metals selected from the group consisting of Ta, W, and Mo.

3. The method of manufacturing a silicon carbide semiconductor device according to claim 1, wherein metal capable of forming the metal carbide is Ti or an alloy of Ti.

4. The method of manufacturing a silicon carbide semiconductor device according to claim 1, wherein the laser beam which falls within a visible region or within an infrared region is a green laser beam (wavelength: 532 nm).

5. The method of manufacturing a silicon carbide semiconductor device according to claim 1, wherein the laser beam irradiating step is performed under a condition that the metal carbide is formable on a boundary face between the silicon carbide semiconductor base body and the thin metal film, and a temperature of a first main surface side of the silicon carbide semiconductor base body at the time of forming the metal carbide by a laser beam which passes through the thin metal film remains at or below a maximum process temperature at the time of forming an element.

6. The method of manufacturing a silicon carbide semiconductor device according to claim 1, wherein a thickness of the thin metal film formed in the thin metal film forming step falls within a range of from 50 nm to 350 nm.

7. The method of manufacturing a silicon carbide semiconductor device according to claim 1, wherein, in the etching step, silicon oxide possibly formed on the surface side of the metal carbide is also removed by etching by the non-oxidizing chemical solution.

8. The method of manufacturing a silicon carbide semiconductor device according to claim 1, wherein the polishing step is performed such that an arithmetic average roughness Ra of the second main surface falls within a range of from 30 nm to 300 nm.

9. The method of manufacturing a silicon carbide semiconductor device according to claim 1, wherein the laser beam irradiating step is performed under a condition that the laser beam is not irradiated onto a scribe line.

* * * * *